United States Patent
Bing

(10) Patent No.: US 11,387,424 B2
(45) Date of Patent: Jul. 12, 2022

(54) ORGANIC LIGHT EMITTING DIODE DISPLAY DEVICE WITH CATHODE LAYER

(71) Applicant: Shenzhen China Star Optoelectronics Semiconductor Display Technology Co., Ltd., Guangdong (CN)

(72) Inventor: Yifei Bing, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 247 days.

(21) Appl. No.: 16/641,641

(22) PCT Filed: Dec. 26, 2019

(86) PCT No.: PCT/CN2019/128681
§ 371 (c)(1),
(2) Date: Feb. 24, 2020

(87) PCT Pub. No.: WO2021/120273
PCT Pub. Date: Jun. 24, 2021

(65) Prior Publication Data
US 2022/0052289 A1  Feb. 17, 2022

(30) Foreign Application Priority Data

Dec. 19, 2019 (CN) .......................... 201911319490.0

(51) Int. Cl.
*H01L 29/08* (2006.01)
*H01L 51/50* (2006.01)
(Continued)

(52) U.S. Cl.
CPC ...... *H01L 51/5072* (2013.01); *H01L 51/5228* (2013.01); *H01L 27/3246* (2013.01);
(Continued)

(58) Field of Classification Search
CPC ............ H01L 51/5072; H01L 51/5228; H01L 27/3246; H01L 27/3283; H01L 2251/5315; H01L 2251/5369
(Continued)

(56) References Cited

U.S. PATENT DOCUMENTS

2018/0269421 A1* 9/2018 Pan .................... H01L 51/5218
2019/0363279 A1* 11/2019 Yamaguchi ......... H01L 51/5253
(Continued)

FOREIGN PATENT DOCUMENTS

| CN | 108417726 A | 8/2018 |
|----|-------------|--------|
| CN | 108417738 A | 8/2018 |

(Continued)

*Primary Examiner* — Phuc T Dang

(57) ABSTRACT

An organic light emitting diode display device includes a substrate, a first defined area disposed on the substrate, a second defined area including a metal layer disposed on the substrate, a bank layer disposed on the substrate, an electron transport layer disposed above the first defined area and the second defined area, and a cathode layer disposed on the electron transport layer. The first defined area includes an anode layer, a hole injection layer, a hole transport layer, and an organic light emitting layer disposed on the substrate in sequentially. The bank layer is disposed at an edge of the first defined area and in the second defined area, and electrically isolates the first defined area and the second defined area. The electron transport layer includes a cathode contact hole used as an auxiliary cathode, which solves uneven light emission of a large-sized panel and improves display effect.

18 Claims, 2 Drawing Sheets

(51) Int. Cl.
*H01L 51/52* (2006.01)
*H01L 27/32* (2006.01)

(52) U.S. Cl.
CPC .. *H01L 27/3283* (2013.01); *H01L 2251/5315* (2013.01); *H01L 2251/5369* (2013.01)

(58) Field of Classification Search
USPC .......................................................... 257/40
See application file for complete search history.

(56) References Cited

U.S. PATENT DOCUMENTS

2020/0168834 A1    5/2020  Bing et al.
2020/0185470 A1*   6/2020  Son .................... H01L 27/3248

FOREIGN PATENT DOCUMENTS

CN    109817669 A    5/2019
CN    110098348 A    8/2019

* cited by examiner

ORGANIC LIGHT EMITTING DIODE DISPLAY DEVICE WITH CATHODE LAYER

BACKGROUND OF INVENTION

Field of Invention

The present invention relates to a display device, and more particularly, to a top emission organic light emitting diode display device.

Description of Prior Art

Organic light emitting diodes belong to display devices that emit light by themselves. Compared with liquid crystal displays, organic light emitting diode display devices have advantages of fast response time, high contrast, and a wide viewing angle, and more.

Referring to FIG. 1, an organic light emitting diode display device 100 includes an anode 102, a hole injection layer 103, a hole transport layer 104, an organic light emitting layer 105, an electron transport layer 106, and a cathode layer 107 sequentially formed on a substrate 101 in sequentially, and a bank layer 108 disposed on both sides of the anode 102, the injection layer 103, the hole transport layer 104, and the organic light emitting layer 105. Generally, the hole injection layer, the hole transport layer, and the organic light emitting layer are formed on the substrate by inkjet printing, and then the electron transport layer and the cathode layer are deposited on the substrate by vacuum thermal evaporation.

At room temperature, electrical resistance of a metal conductor is not zero, and a current passing through the conductor may cause a certain voltage drop. This phenomenon is called IR-drop. As for top emission organic light emitting diode display devices, light is emitted from a side of the cathode layer. Therefore, the cathode layer needs to have good light transmission properties.

SUMMARY OF INVENTION

Currently, top emission organic light emitting diode display device are made composite thin films, and the composite thin films are made of indium zinc oxide or magnesium/silver, which achieves high transmittance. However, conductivity of the cathode layer is deteriorated. It may cause a serious voltage drop phenomenon in the organic light emitting diode display device when the display device is working, and thus uneven light emission of the panel is happened, and display effect is greatly affected.

An organic light emitting diode display device comprises a substrate, a first defined area disposed on the substrate, a second defined area disposed on the substrate, a bank layer disposed on the substrate, an electron transport layer, and a cathode layer disposed on the electron transport layer. The first defined area comprises an anode layer, a hole injection layer, a hole transport layer, and an organic light emitting layer are disposed on the substrate in sequentially. The second defined area comprises a metal layer. The bank layer is disposed at an edge of the first defined area and in the second defined area, and the bank layer electrically isolates the first defined area and the second defined area. The electron transport layer is disposed above the first defined area and the second defined area. The electron transport layer comprises a cathode contact hole.

In one embodiment, the bank layer disposed in the first defined area comprises a hydrophilic bank layer and a hydrophobic bank layer.

In one embodiment, the hole injection layer, the hole transport layer, and the organic light emitting layer are sequentially formed on the anode layer by inkjet printing.

In one embodiment, the hydrophobic bank layer surrounds the hole injection layer, the hole transport layer, and the organic light emitting layer.

In one embodiment, the cathode contact hole is made of organic materials and metal nanoparticles.

In one embodiment, the cathode layer is electrically connected to the metal layer through the electron transport layer.

In one embodiment, the electron transport layer and the cathode layer are deposited on the organic light emitting layer, the bank layer, and the metal layer by vacuum thermal evaporation.

In one embodiment, density of the cathode contact hole is decreased from a center of the display panel to a periphery of the display panel.

In one embodiment, the organic light emitting diode display device further comprises a first cathode contact hole area, a second cathode contact hole area, a third cathode contact hole area, a fourth cathode contact hole area, and a fifth cathode contact hole area. A ratio of the number of the cathode contact holes to a number of pixels in the first cathode contact hole area is 1:3. A ratio of the number of the cathode contact holes to a number of pixels in the second cathode contact hole area is 1:4. A ratio of the number of the cathode contact holes to a number of pixels in the third cathode contact hole area is 1:6. A ratio of the number of the cathode contact holes to a number of pixels in the fourth cathode contact hole area is 1:12. A ratio of the number of the cathode contact holes to the number of pixels in the fifth cathode contact hole area is 1:30. The first cathode contact hole area, the second cathode contact hole area, the third cathode contact hole area, the fourth cathode contact hole area, and the fifth cathode contact hole area are disposed concentrically from the inside to the outside of a panel.

In one embodiment, the organic light emitting diode display device is a top emission organic light emitting diode display device.

An organic light emitting diode display device comprises a substrate, a first defined area disposed on the substrate, a second defined area disposed on the substrate, a bank layer disposed on the substrate, an electron transport layer, and a cathode layer disposed on the electron transport layer. The second defined area comprises a metal layer. The bank layer is disposed at an edge of the first defined area and in the second defined area, and the bank layer electrically isolates the first defined area and the second defined area. The electron transport layer is disposed above the first defined area and the second defined area. The electron transport layer comprises a cathode contact hole.

In one embodiment, the first defined area comprises an anode layer, a hole injection layer, a hole transport layer, and an organic light emitting layer are disposed on the substrate in sequentially In one embodiment, the bank layer disposed in the first defined area comprises a hydrophilic bank layer and a hydrophobic bank layer.

In one embodiment, the hole injection layer, the hole transport layer, and the organic light emitting layer are sequentially formed on the anode layer by inkjet printing.

In one embodiment, the hydrophobic bank layer surrounds the hole injection layer, the hole transport layer, and the organic light emitting layer.

In one embodiment, the cathode contact hole is made of organic materials and metal nanoparticles.

In one embodiment, the cathode layer is electrically connected to the metal layer through the electron transport layer.

In one embodiment, the electron transport layer and the cathode layer are deposited on the organic light emitting layer, the bank layer, and the metal layer by vacuum thermal evaporation.

In one embodiment, density of the cathode contact hole is decreased from a center of the display panel to a periphery of the display panel.

In one embodiment, the organic light emitting diode display device further comprises a first cathode contact hole area, a second cathode contact hole area, a third cathode contact hole area, a fourth cathode contact hole area, and a fifth cathode contact hole area. A ratio of the number of the cathode contact holes to a number of pixels in the first cathode contact hole area is 1:3. A ratio of the number of the cathode contact holes to a number of pixels in the second cathode contact hole area is 1:4. A ratio of the number of the cathode contact holes to a number of pixels in the third cathode contact hole area is 1:6. A ratio of the number of the cathode contact holes to a number of pixels in the fourth cathode contact hole area is 1:12. A ratio of the number of the cathode contact holes to the number of pixels in the fifth cathode contact hole area is 1:30. The first cathode contact hole area, the second cathode contact hole area, the third cathode contact hole area, the fourth cathode contact hole area, and the fifth cathode contact hole area are disposed concentrically from the inside to the outside of a panel.

The organic light emitting diode display device used a cathode contact hole as an auxiliary cathode to effectively solve the problem of uneven light emission of a large-sized panel and improve the display effect.

DETAILED DESCRIPTION OF PREFERRED EMBODIMENTS

Figure 1:
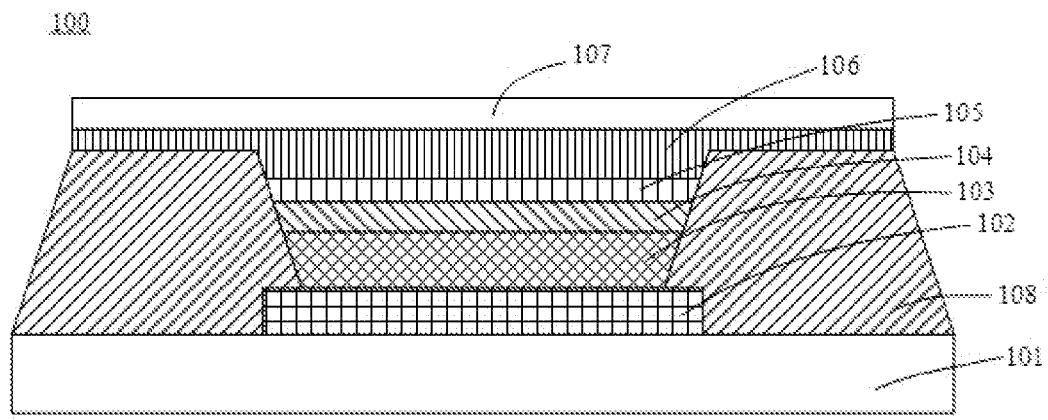
FIG. 1 is a schematic view of a conventional top emission organic light emitting diode display device.
Figure 2:
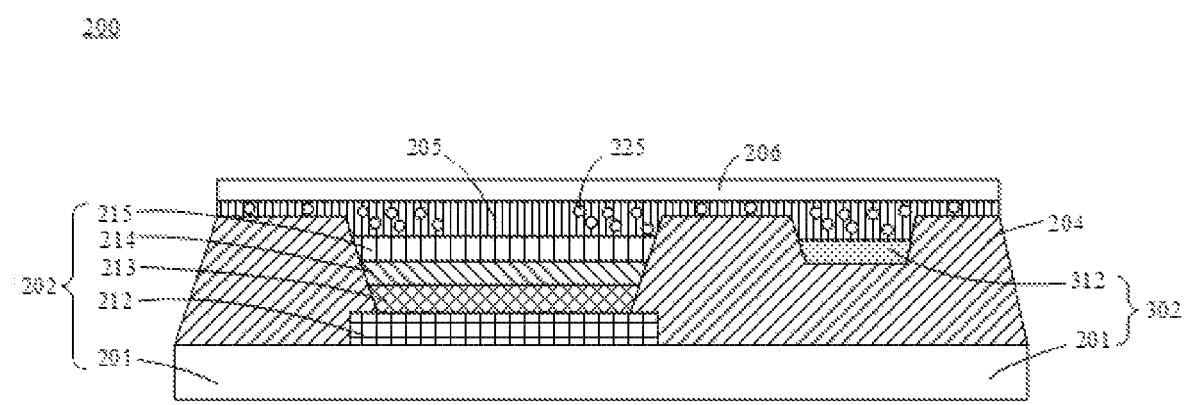
FIG. 2 is a schematic view of a top emission organic light emitting diode display device according to one embodiment of the present invention.

Referring to FIG. 2, an organic light emitting diode display device 200 is a top emission organic light emitting diode display device. The organic light emitting diode display device 200 includes a substrate 201, a first defined area 202 disposed on the substrate 201, a second defined area 302 disposed on the substrate 201, a bank layer 204 disposed on the substrate 201, an electron transport layer 205, and a cathode layer 206 disposed on the electron transport layer 205.

Specifically, the bank layer 204 disposed in the first defined area 202 includes a hydrophilic bank layer and a hydrophobic bank layer. The first defined area 202 includes an anode layer 212, a hole injection layer 213, a hole transport layer 214, and an organic light emitting layer 215, which are sequentially disposed on the substrate 201 in sequentially. The hole injection layer 213, the hole transport layer 214, and the organic light emitting layer 215 are sequentially formed on the anode layer 212 by inkjet printing. The hydrophobic bank layer surrounds the hole injection layer 213, the hole transport layer 214, and the organic light emitting layer 215. In addition, the second defined area 302 includes a metal layer 312 disposed on the bank layer 204, and the bank layer 204 is disposed at an edge of the first defined area 202 and in the second defined area 302. The bank layer 204 electrically isolates the first defined area 202 and the second defined area 302. The electron transport layer 205 is disposed above the first defined area 202 and the second defined area 302. The electron transport layer 205 and the cathode layer 206 are deposited on the organic light emitting layer 215, the bank layer 204, and the metal layer 312 by vacuum thermal evaporation. The electron transport layer 205 includes a cathode contact hole 225.

It should be noted that the cathode contact hole 225 is made of organic materials and metal nanoparticles. Since the electron transport layer 205 includes the cathode contact hole 225 made of the organic materials and the metal nanoparticles, the electron transport layer 205 has high conductivity, thereby enabling the anode layer 212 and the metal layer 312 to be directly conducted, and the impedance of the cathode layer 206 can be reduced.

Figure 3:
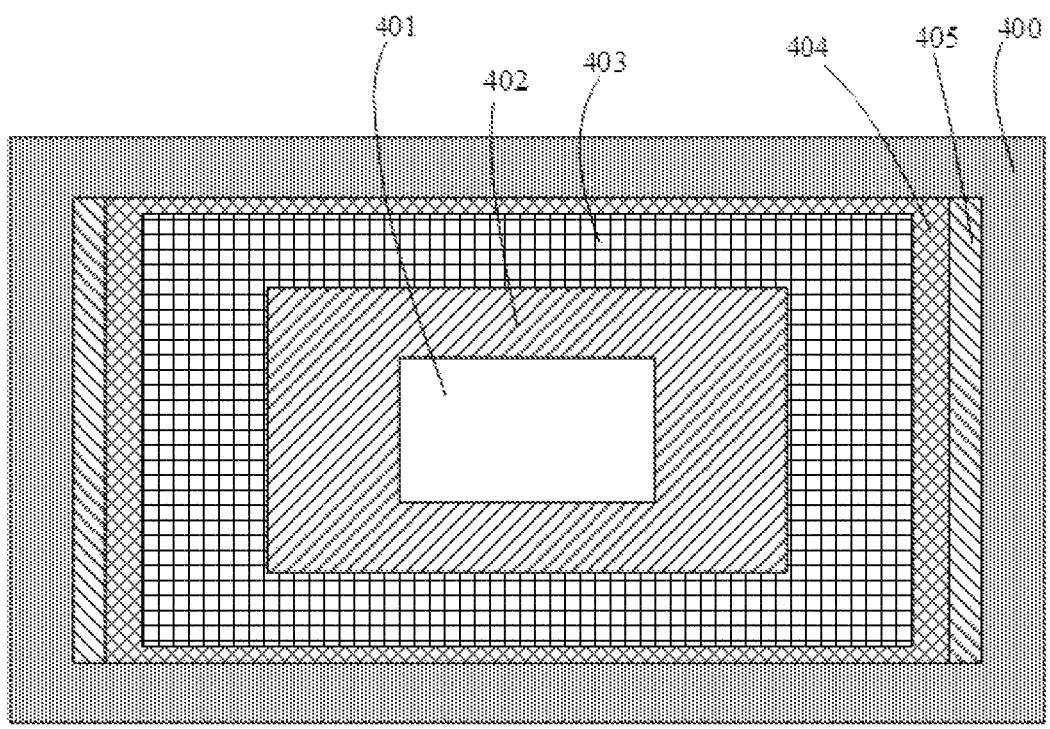
FIG. 3 is a schematic view of a cathode contact hole distribution in the emission organic light emitting diode display device according to one embodiment of the present invention.

Referring to FIG. 3, a panel 400 of the organic light emitting diode display device further includes a first cathode contact hole area 401, a second cathode contact hole area 402, a third cathode contact hole area 403, a fourth cathode contact hole area 404, and a fifth cathode contact hole area 404.

All of the central points of the first cathode contact hole area 401, the second cathode contact hole area 402, the third cathode contact hole area 403, the fourth cathode contact hole area 404, and the fifth cathode contact hole area 405 are at the same position. Specifically, the first cathode contact hole area 401, the second cathode contact hole area 402, the third cathode contact hole area 403, the fourth cathode contact hole area 404, and the fifth cathode contact hole area 405 are disposed concentrically from the inside to the outside of the panel. The first cathode contact hole area 401 is disposed at the center of the panel 400. A length of the first cathode contact hole area 401 is ¼ a length of the entire panel 400. A width of the first cathode contact hole area 401 is ¼ a width of the entire panel 400. A length of the second cathode contact hole area 402 is ½ a length of the entire panel 400. A width of the second cathode contact hole area 402 is ½ a width of the entire panel 400. A length of the third cathode contact hole area 403 is ¾ a length of the entire panel 400. A width of the third cathode contact hole area 403 is ¾ a width of the entire panel 400. A length of the fourth cathode contact hole area 404 is $25/32$ a length of the entire panel 400. A width of the fourth cathode contact hole area 404 is $31/40$ a width of the entire panel 400. A length of the fifth cathode contact hole area 405 is $26/32$ a length of the entire panel 400. A width of the fifth cathode contact hole area 405 is $63/80$ a width of the entire panel 400.

Specifically, a ratio of the number of the cathode contact holes to a number of pixels in the first cathode contact hole area 401 is 1:3; a ratio of the number of the cathode contact holes to a number of pixels in the second cathode contact hole area 402 is 1:4; a ratio of the number of the cathode contact holes to a number of pixels in the third cathode contact hole area 403 is 1:6; a ratio of the number of the cathode contact holes to a number of pixels in the fourth cathode contact hole area 404 is 1:12; and a ratio of the number of the cathode contact holes to the number of pixels in the fifth cathode contact hole area 405 is 1:30.

Hence, it can be known that a density of the cathode contact holes is decreased from the center of the display panel to a periphery of the display panel. By adjusting the density distribution of the cathode contact holes on the panel, the light emission of the organic light emitting diode devices can be uniform, and the conductivity of the cathode layer of the organic light emitting diode devices is not reduced. Therefore, image display effect is improved, and voltage drop will not occur.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. An organic light emitting diode display device, comprising:
    a substrate;
        a first defined area disposed on the substrate, wherein the first defined area comprises an anode layer, a hole injection layer, a hole transport layer, and an organic light emitting layer are sequentially disposed on the substrate;
    a second defined area disposed on the substrate, wherein the second defined area comprises a metal layer;
        a bank layer disposed on the substrate, wherein the bank layer is disposed at an edge of the first defined area and in the second defined area, the bank layer electrically isolates the first defined area and the second defined area, and the metal layer is disposed on the bank layer;
    an electron transport layer, wherein the electron transport layer is disposed above the first defined area and the second defined area, and the electron transport layer comprises a cathode contact hole; and
        a cathode layer disposed on the electron transport layer, wherein the cathode layer is electrically connected to the metal layer through the electron transport layer.

2. The organic light emitting diode display device according to claim 1, wherein the bank layer disposed in the first defined area comprises a hydrophilic bank layer and a hydrophobic bank layer.

3. The organic light emitting diode display device according to claim 2, wherein the hydrophobic bank layer surrounds the hole injection layer, the hole transport layer, and the organic light emitting layer.

4. The organic light emitting diode display device according to claim 1, wherein the hole injection layer, the hole transport layer, and the organic light emitting layer are sequentially formed on the anode layer by inkjet printing.

5. The organic light emitting diode display device according to claim 1, wherein the cathode contact hole is made of organic materials and metal nanoparticles.

6. The organic light emitting diode display device according to claim 1, wherein the electron transport layer and the cathode layer are deposited on the organic light emitting layer, the bank layer, and the metal layer by vacuum thermal evaporation.

7. The organic light emitting diode display device according to claim 1, wherein density of the cathode contact hole is decreased from a center of the display panel to a periphery of the display panel.

8. The organic light emitting diode display device according to claim 1, further comprising:
    a first cathode contact hole area, wherein a ratio of the number of the cathode contact holes to a number of pixels in the first cathode contact hole area is 1:3;
    a second cathode contact hole area, wherein a ratio of the number of the cathode contact holes to a number of pixels in the second cathode contact hole area is 1:4;
    a third cathode contact hole area, wherein a ratio of the number of the cathode contact holes to a number of pixels in the third cathode contact hole area is 1:6;
    a fourth cathode contact hole area, wherein a ratio of the number of the cathode contact holes to a number of pixels in the fourth cathode contact hole area is 1:12; and
    a fifth cathode contact hole area, wherein a ratio of the number of the cathode contact holes to the number of pixels in the fifth cathode contact hole area is 1:30;
    wherein the first cathode contact hole area, the second cathode contact hole area, the third cathode contact hole area, the fourth cathode contact hole area, and the fifth cathode contact hole area are disposed concentrically from the inside to the outside of a panel.

9. The organic light emitting diode display device according to claim 1, wherein the organic light emitting diode display device is a top emission organic light emitting diode display device.

10. An organic light emitting diode display device, comprising:
    a substrate;
    a first defined area disposed on the substrate;
    a second defined area disposed on the substrate, wherein the second defined area comprises a metal layer;
    a bank layer disposed on the substrate, wherein the bank layer is disposed at an edge of the first defined area and in the second defined area, the bank layer electrically isolates the first defined area and the second defined area, and the metal layer is disposed on the bank layer;
    an electron transport layer, wherein the electron transport layer is disposed above the first defined area and the second defined area, and the electron transport layer comprises a cathode contact hole; and
    a cathode layer disposed on the electron transport layer, wherein the cathode layer is electrically connected to the metal layer through the electron transport layer.

11. The organic light emitting diode display device according to claim 10, wherein the first defined area comprises an anode layer, a hole injection layer, a hole transport layer, and an organic light emitting layer sequentially disposed on the substrate.

12. The organic light emitting diode display device according to claim 11, wherein the hole injection layer, the hole transport layer, and the organic light emitting layer are sequentially formed on the anode layer by inkjet printing.

13. The organic light emitting diode display device according to claim 11, wherein the electron transport layer and the cathode layer are deposited on the organic light emitting layer, the bank layer, and the metal layer by vacuum thermal evaporation.

14. The organic light emitting diode display device according to claim 10, wherein the bank layer disposed in the first defined area comprises a hydrophilic bank layer and a hydrophobic bank layer.

15. The organic light emitting diode display device according to claim 14, wherein the hydrophobic bank layer surrounds the hole injection layer, the hole transport layer, and the organic light emitting layer.

16. The organic light emitting diode display device according to claim 10, wherein the cathode contact hole is made of organic materials and metal nanoparticles.

17. The organic light emitting diode display device according to claim 10, wherein density of the cathode contact hole is decreased from a center of the display panel to a periphery of the display panel.

18. The organic light emitting diode display device according to claim 10, further comprising:
  a first cathode contact hole area, wherein a ratio of the number of the cathode contact holes to a number of pixels in the first cathode contact hole area is 1:3;
  a second cathode contact hole area, wherein a ratio of the number of the cathode contact holes to a number of pixels in the second cathode contact hole area is 1:4;
  a third cathode contact hole area, wherein a ratio of the number of the cathode contact holes to a number of pixels in the third cathode contact hole area is 1:6;
  a fourth cathode contact hole area, wherein a ratio of the number of the cathode contact holes to a number of pixels in the fourth cathode contact hole area is 1:12; and
  a fifth cathode contact hole area, wherein a ratio of the number of the cathode contact holes to the number of pixels in the fifth cathode contact hole area is 1:30;
  wherein the first cathode contact hole area, the second cathode contact hole area, the third cathode contact hole area, the fourth cathode contact hole area, and the fifth cathode contact hole area are disposed concentrically from the inside to the outside of a panel.

* * * * *